US006817903B1

(12) United States Patent
Ramkumar et al.

(10) Patent No.: US 6,817,903 B1
(45) Date of Patent: Nov. 16, 2004

(54) PROCESS FOR REDUCING LEAKAGE IN AN INTEGRATED CIRCUIT WITH SHALLOW TRENCH ISOLATED ACTIVE AREAS

(75) Inventors: Krishnaswamy Ramkumar, San Jose, CA (US); Kaichiu Wong, Sunnyvale, CA (US); Venuka Jayatilaka, Farmington, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 159 days.

(21) Appl. No.: 09/635,507

(22) Filed: Aug. 9, 2000

(51) Int. Cl.$^7$ ............................................ H01L 21/311

(52) U.S. Cl. ..................................................... 439/702

(58) Field of Search ..................... 117/2, 3; 438/694, 438/700, 701, 424, 702, 703

(56) References Cited

U.S. PATENT DOCUMENTS

| | | | | |
|---|---|---|---|---|
| 5,427,055 A | * | 6/1995 | Ichikawa ..................... | 117/92 |
| 5,447,884 A | * | 9/1995 | Fahey et al. .................. | 437/67 |
| 5,468,676 A | | 11/1995 | Madan ........................ | 437/70 |
| 5,858,858 A | | 1/1999 | Park et al. ................... | 438/424 |
| 5,910,018 A | | 6/1999 | Jang ........................... | 438/425 |
| 5,950,096 A | | 9/1999 | Huang et al. ................ | 438/443 |
| 5,960,299 A | | 9/1999 | Yew et al. ................... | 438/424 |
| 5,994,178 A | | 11/1999 | Wu ............................ | 438/221 |
| 6,001,706 A | | 12/1999 | Tan et al. .................... | 438/424 |
| 6,004,864 A | | 12/1999 | Huang et al. ................ | 438/433 |
| 6,005,279 A | | 12/1999 | Luning ....................... | 257/510 |
| 6,013,561 A | | 1/2000 | Jang et al. ................... | 438/452 |
| 6,020,251 A | | 2/2000 | Peng et al. .................. | 438/425 |
| 6,033,968 A | | 3/2000 | Sung .......................... | 438/424 |

(List continued on next page.)

OTHER PUBLICATIONS

Wolf et al., Silicon Processing for the VLSI Era, vol. 1: Process Technology, Lattice Press, Sunset Beach, CA, USA, pp. 218–219, 228, 1986.*

(List continued on next page.)

Primary Examiner—Nadine G. Norton
Assistant Examiner—Matthew Anderson
(74) Attorney, Agent, or Firm—Wagner, Murabito, & Hao LLP

(57) ABSTRACT

A method and process reducing or eliminating electrical leakage between active areas in a semiconductor separated by isolation regions. A method and process are disclosed for the fabrication of an isolation region in a semiconductor. The method and process can be used in the fabrication of isolation regions used for the separation of adjacent active areas in an integrated circuit. A shallow trench is created on the surface of the semiconductor in regions where isolation spaces are to be formed. A layer of silicon dioxide (LINOX) is then grown over the surfaces of the trench. The LINOX covers roughened regions formed along the surfaces of the trench during its formation. The LINOX is then annealed at a temperature above the LINOX deposition temperature for a period of time. Annealing reduces stresses in the LINOX and in the surrounding semiconductor material. Annealing also increases the density of the LINOX. Thus annealing increases the LINOX resistance to gouge during subsequent processing. This leads to a reduction in dislocations in the semiconductor and a reduction in electrical leakage around the isolation region. A more robust LINOX and a reduction in electrical leakage around an isolation region allows the further shrinkage of integrated circuit dimensions. Furthermore, denuding and gettering of the semiconductor are both accomplished during the annealing step which results in a shortening of total processing time. Finally, since gouging of the LINOX no longer occurs where poly/spacer etch overlaps an active area corner, restrictions on placement of poly lines have been eliminated.

11 Claims, 9 Drawing Sheets

U.S. PATENT DOCUMENTS

| | | | |
|---|---|---|---|
| 6,037,018 A | | 3/2000 | Jang et al. .................. 427/579 |
| 6,037,238 A | * | 3/2000 | Chang et al. ................ 438/426 |
| 6,140,208 A | * | 10/2000 | Agahi et al. ................. 438/437 |
| 6,150,234 A | * | 11/2000 | Olsen et al. ................. 438/424 |
| 6,277,706 B1 | * | 8/2001 | Ishikawa .................... 438/424 |
| 6,319,794 B1 | * | 11/2001 | Akatsu et al. .............. 438/424 |
| 6,350,662 B1 | * | 2/2002 | Thei et al. .................. 438/435 |
| 6,374,770 B1 | * | 4/2002 | Lee et al. ................. 118/723 E |
| 2001/0021567 A1 | * | 9/2001 | Takahashi ................... 438/424 |
| 2001/0021595 A1 | * | 9/2001 | Jang ............................ 438/787 |
| 2001/0044193 A1 | * | 11/2001 | Lan et al. ................... 438/424 |

OTHER PUBLICATIONS

Wolf et al., Siclicon Processing for the VLSI Era, Process Technology, Lattice Press, Sunset Beach, CA, USA, pp. 56–70, 1986.*

* cited by examiner

PROCESS FOR REDUCING LEAKAGE IN AN INTEGRATED CIRCUIT WITH SHALLOW TRENCH ISOLATED ACTIVE AREAS

BACKGROUND OF THE INVENTION

1. Field of the Invention

The present invention relates to the field of semiconductor processing. More specifically, the present invention relates to the isolation of active areas on a semiconductor wafer.

2. Related Art

Isolating adjacent active areas is a very essential requirement as device dimensions are scaled down on an integrated circuit (IC). As the scaling gets down below 0.25 um technology, the Local Oxidation of Silicon (LOCOS) isolation scheme fails because the thickness of the grown isolating oxide is not adequate for the narrow space. In addition, the large encroachment associated with the LOCOS scheme makes it difficult to get the required active area width. LOCOS also has high temperature and long oxidation periods. Shallow Trench Isolation (STI) is widely used to isolate active areas in VLSI technologies with critical dimensions less than 0.25 um. This method provides robust isolation when the space between P+ and N+active areas gets down below about 0.80 um since the thickness of the isolation regions is not significantly limited and the encroachment is very small.

The STI process used currently involves creation of trenches of depth of about 3000 angstroms to 4000 angstroms in silicon in regions where isolation spaces are to be formed. The pattern of the spaces is etched in a silicon nitride layer deposited on top of a pad oxide. After the formation of the trench pattern, silicon dioxide is deposited by a Chemical Vapor Deposition (CVD) process to fill the trenches. The oxide is polished using the silicon nitride as the stopping layer. The nitride is then stripped off to get the pattern of the active areas with isolating oxide spaces.

Shallow Trench Isolation however, has its own problems nominally because the oxide in the isolating regions is not grown but deposited and the stress levels in this oxide can become very high. The stress levels may be increased further by the shape of the active/isolation pattern. Active areas with sharp bends or corners are more prone to problems with stress. This stress, combined with the damage caused by plasma etch such as spacer etch lead to the formation of nucleation sites for dislocations. Bombardment by heavy ions such as arsenic during ion implantation can lead to dislocations in the silicon crystal in these sites. These dislocations at the surface when intersecting the source/drain to substrate P-N junctions can give rise to severe reverse leakage in these junctions that can either seriously affect the functionality of a Static Random Access Memory (SRAM) cell or can give rise to very high standby current in the cell.

Stress induced defects are seen near poly lines. When a poly line crosses an active area, there is likely to be a gouge into the active area next to the poly edge due to the poly/spacer etch. The gouge may also generate some nucleation sites for dislocations. The extent of gouge and or dislocation generation is decided by the quality of the oxide at the edge of the active area, which is mainly the liner oxide. Depending on where the poly line intersects the active area, the extent of damage caused by the spacer etch may be different. When the active area is straight, the liner oxide grown after trench etch is stress free and hence may be able to withstand the poly/spacer etch better. On the other hand, when the active area has a corner, the liner oxide grown in this region has high stress and hence may be more prone to gouge when a poly line crosses the corner. Thus in a SRAM cell, a poly line crossing the corner of an active area may give rise to dislocations. This will lead to leakage in the N+ to P-substrate junctions which will lead to failure of the cell.

SUMMARY OF THE INVENTION

Accordingly, what is needed is a method and process for the fabrication of an isolation region in a semiconductor which will reduce or eliminate leakage between active areas. What is needed yet is a method and process in which the fabrication time for an isolation region in a semiconductor is reduced. What is also needed is a method and process which allows the further shrinkage of integrated circuits to smaller sizes compatible with the next technology generation. The present invention provides these advantages and others not specifically mentioned above but described in the sections to follow.

A method and process are disclosed for the fabrication of an isolation region in a semiconductor crystal. The method and process may be used in the fabrication of isolation regions used for the separation of adjacent active areas in an integrated circuit. A shallow trench is created on the surface of the semiconductor in regions where isolation spaces are to be formed. A layer of silicon dioxide (LINOX) is then grown over the surfaces of the trench. The LINOX covers roughened regions formed along the surfaces of the trench during its formation.

In one embodiment of the present invention, the liner oxidation recipe calls for growing the LINOX in the presence of oxygen and chlorine at a temperature of about 1000 degrees Centigrade. In one embodiment of the present invention, immediately following the growth of the LINOX, the temperature is increased to about 1050 degrees Centigrade for a period of time sufficient in order to anneal the LINOX. The remaining volume of the trench is then filled with silicon dioxide by Chemical Vapor Deposition (CVD). The surface of the semiconductor is then polished to reveal the pattern of active areas with isolating oxide regions.

In one embodiment of the present invention, the step of annealing the LINOX provides a number of distinct advantages. First of all, annealing greatly reduces stresses in the LINOX and in the surrounding semiconductor material. Annealing also increases the density of the LINOX. Thus annealing increases the LINOX resistance to damage or gouge during any subsequent etching; for instance during a poly/spacer etch. This leads to a reduction in dislocations in the semiconductor crystal and an attendant reduction in electrical leakage around the isolation region. In one embodiment of the present invention, the electrical leakage in a SRAM cell with shallow trench isolated active areas having sharp corners is reduced. A more robust LINOX and a reduction in electrical leakage around an isolation region allows for the further shrinkage of integrated circuit dimensions. In one embodiment of the present invention, a reduction in the dimensions of a Static Random Access Memory (SRAM) cell is made possible. Furthermore, denuding and gettering of the semiconductor are both accomplished during the annealing step which results in a shortening of total processing time. Finally, since gouging of the LINOX no longer occurs where poly/spacer etch overlaps an active area corner, restrictions on the placement of poly lines have been eliminated.

DETAILED DESCRIPTION OF THE INVENTION

In the following detailed description of the present invention, a process for reducing leakage in a SRAM cell with shallow trench isolated active areas, numerous specific details are set forth in order to provide a thorough understanding of the present invention. However, it will be obvious to one skilled in the art that the present invention may be practiced without these specific details. In other instances, well known methods, procedures, components, and circuits have not been described in detail, as not to unnecessarily obscure aspects of the present invention. For instance, the substrate used could be silicon or could also be other substrate materials, such as SiGe.

Figure 1:
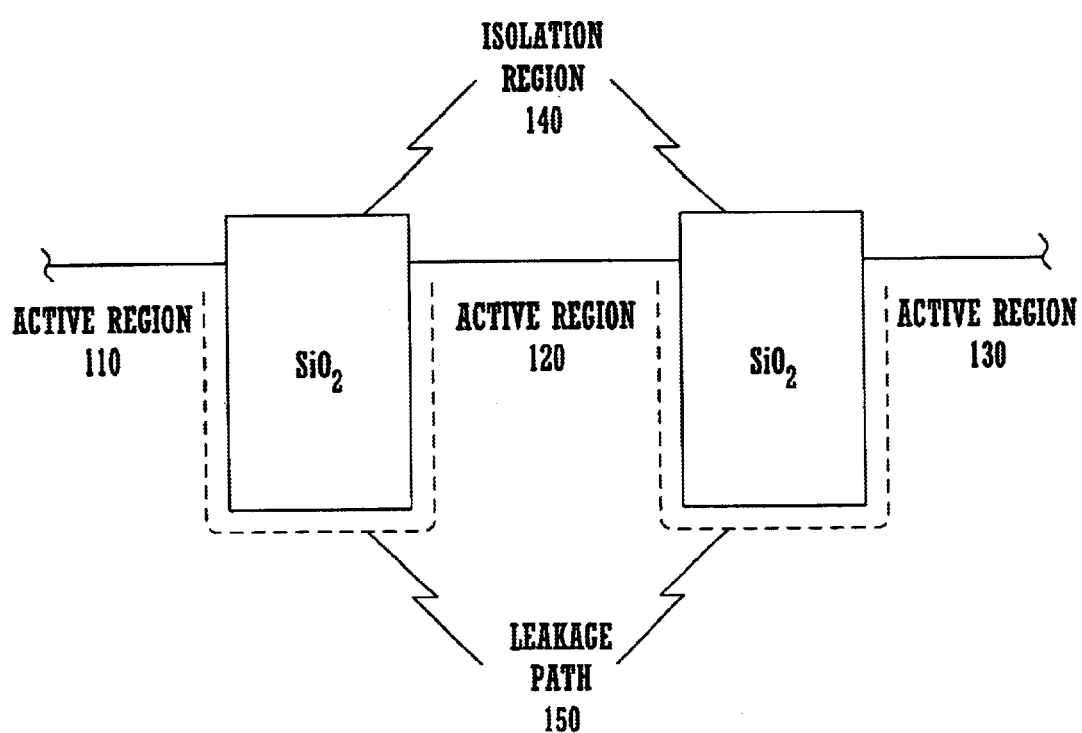
FIG. 1 illustrates an exemplary Shallow Trench Isolation scheme in accordance with one embodiment of the present invention.

FIG. 1 illustrates an exemplary Shallow Trench Isolation (STI) scheme in accordance with one embodiment of the present invention. An integrated circuit may be realized by locating active semiconductor devices in the active regions 110, 120 and 130. Electrical isolation of active regions may be realized by the formation of shallow trenches in the surface of the semiconductor substrate between the active regions, which may then be filled with silicon dioxide to form isolation regions 140. The minimization or elimination of electrical leakage currents between active regions along a leakage path 150 is a primary objective. In the present invention, the process used to form isolation regions 140 results in a reduction in electrical leakage currents between active regions when compared with prior art methods. These and other advantages of the present invention not specifically enumerated above will become clear within discussions of the present invention below.

Figure 2:
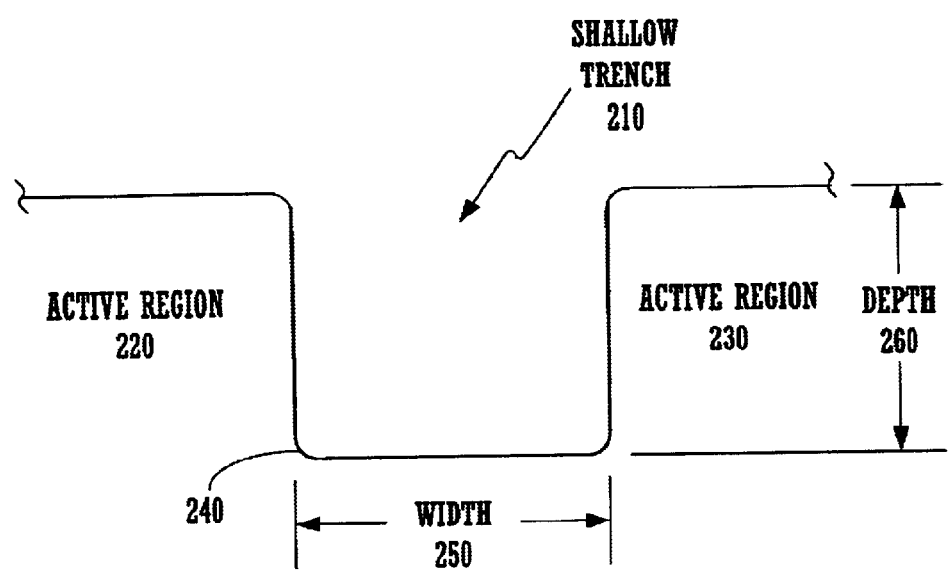
FIG. 2 is the cross-sectional view of a single trench in accordance with one embodiment of the present invention.

FIG. 2 is the cross-sectional view of a shallow trench 210 separating two active regions 220 and 230 in a semiconductor substrate 200 in accordance with one embodiment of the present invention. In one embodiment of the present invention, the trench may be formed by plasma etching. A small trench width 250 may be preferred to accommodate smaller integrated circuit geometry. A larger trench depth 260 may reduce electrical current leakage between active regions 220 and 230. The plasma etch used to form the trench results in uneven trench surfaces 240. These uneven surfaces lead to the formation of stress regions and dislocations in the active regions during subsequent processing steps as described below. Regions of stress and dislocations may in turn result in increased electrical leakage between active areas as well as active device failure. In one embodiment, the shallow trench having a width of at most $0.3\mu$ with fallback widths of $0.25\mu$ and $0.21\mu$.

Figure 3:
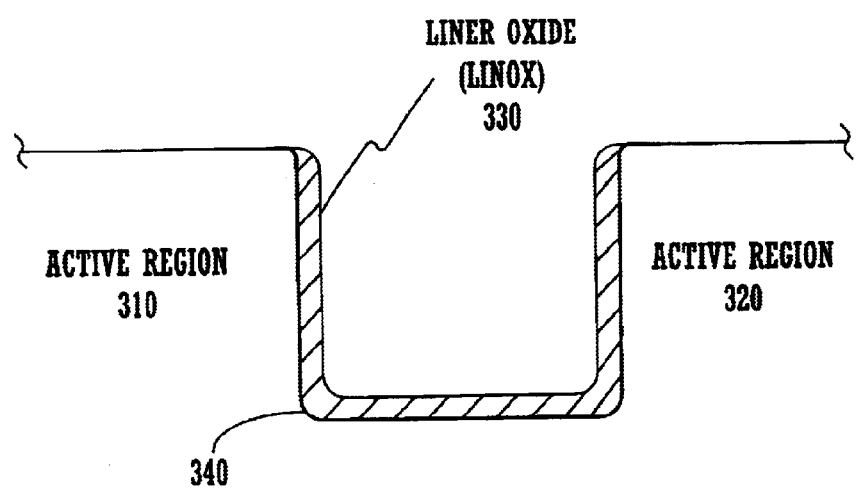
FIG. 3 illustrates a cross-sectional view showing the grown Liner Oxide (LINOX) applied to the walls of the trench, in accordance with one embodiment of the present invention.

In the present invention, a layer of silicon dioxide, referred to as the Liner Oxide layer (LINOX), may be grown over the inner surfaces of the trench to cover the unevenness and to reduce occurrences of dislocations. FIG. 3 illustrates a cross-sectional view 300 showing the grown Liner Oxide (LINOX) 330 covering the uneven inner surfaces of the trench 340. The trench separates the two active regions 310 and 320. Since the LINOX 330 is grown, it becomes an integral part of the semiconductor substrate, as opposed to silicon dioxide that is deposited on the surface of the substrate by Chemical Vapor Deposition (CVD). Following the LINOX growth step, the temperature is elevated slightly for a period of time to anneal the LINOX 330. In one embodiment of the present invention, the LINOX 330 may be grown at a temperature of 1000 degrees centigrade, and annealing of the LINOX 330 may be accomplished over a period of 3 hours at a temperature of 1050 degrees centigrade.

Annealing causes an increase in density of the LINOX 330 which increases its strength and relieves stresses which may form along the trench surfaces at corners or at sharp edges. The increased strength of the LINOX 330 causes it to be insensitive to subsequent processing steps. Relieving the stresses in the LINOX 330 (especially at the corners) may result in a reduction in or elimination of dislocations in the semiconductor substrate which in turn may reduce electrical leakage currents between active areas. An additional advantage of the present invention is the accomplishment of denuding and gettering that occur during the annealing process.

Figure 4:
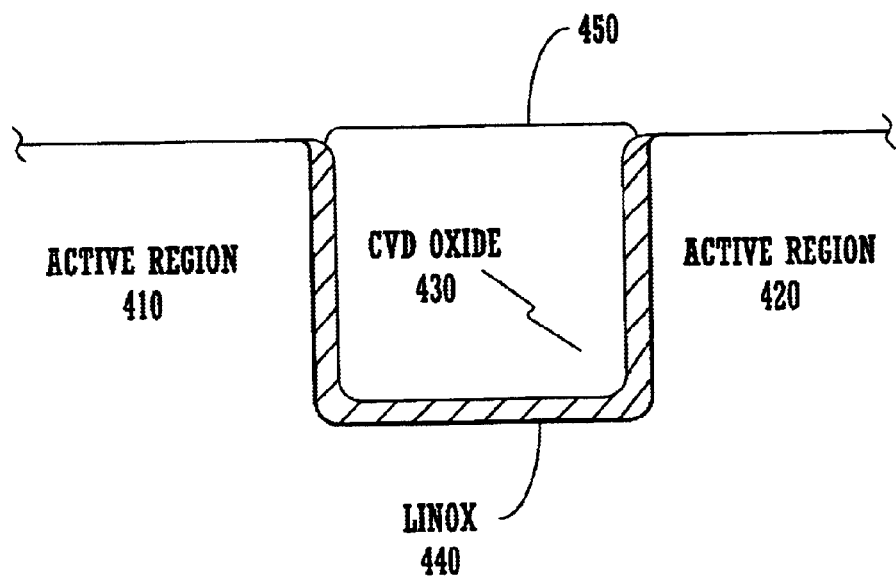
FIG. 4 illustrates a cross-sectional view showing silicon dioxide trench filler deposited by Chemical Vapor Deposition (CVD) in accordance with one embodiment of the present invention.

FIG. 4 illustrates a cross-sectional view 400 of a Shallow Trench Isolation (STI) region 450 separating two active regions 410 and 420. The silicon dioxide trench filler 430 may be deposited by Chemical Vapor Deposition (CVD) in accordance with one embodiment of the present invention. The LINOX 440 separates the deposited CVD oxide 430 from the semiconductor substrate active regions 410 and 420. As a result, the large stresses that occur when oxide is deposited by CVD directly into a trench without the LINOX may be eliminated. Thus the dislocations formed in the semiconductor substrate due to these stresses may also be eliminated in accordance with the present invention.

Figure 5:
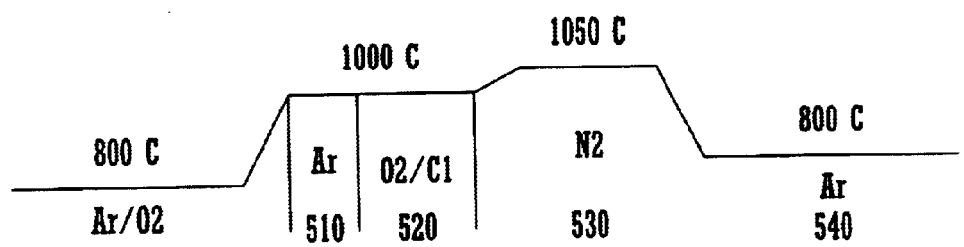
FIG. 5 is a process diagram of the recipe for annealing the LINOX in accordance with one embodiment of the present invention.

FIG. 5 is an exemplary process diagram 500 which may be used to grow a liner oxide (LINOX) in a shallow trench on a semiconductor substrate in accordance with one embodiment of the present invention. At step 510, the semiconductor temperature is stabilized in the presence of Argon at 1000 degrees centigrade. In step 520, the LINOX is grown to the desired depth by holding the semiconductor at a temperature of 1000 degrees centigrade in the presence of oxygen and chlorine for a period of time. The semiconductor temperature is then increased in step 530 to 1050 degrees centigrade for a period of three hours to accomplish the annealing of the LINOX. During step 530, the density of the LINOX is increased density, stresses between the LINOX and the semiconductor substrate are relieved, and denuding and gettering are both accomplished. In step 540, the temperature is then reduced to the starting point of 800 degrees centigrade for further processing. It is appreciated that other possible gases besides Argon can be used, and also other possible sources of oxygen can be used.

Figure 6:
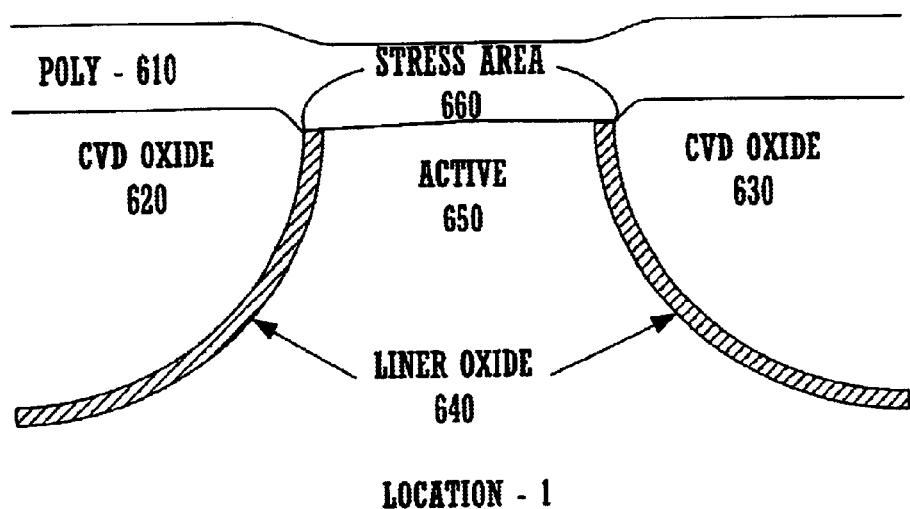
FIG. 6 is a cross-sectional view showing a poly line passing over a Shallow Trench Isolation (STI) region in accordance with one embodiment of the present invention.

In subsequent processing steps, appropriate electrical connections between components to form an integrated circuit can be made by utilizing polysilicon (poly) strips as conductors. As illustrated in the cross-sectional view 600 in FIG. 6, the poly 610 may pass over both active regions 650 as well as isolation regions 620 and 630. Etching of the poly, during a step referred to as poly/spacer etch, may gouge the liner oxide 640 at points of excessive stress 660.

Figure 7:
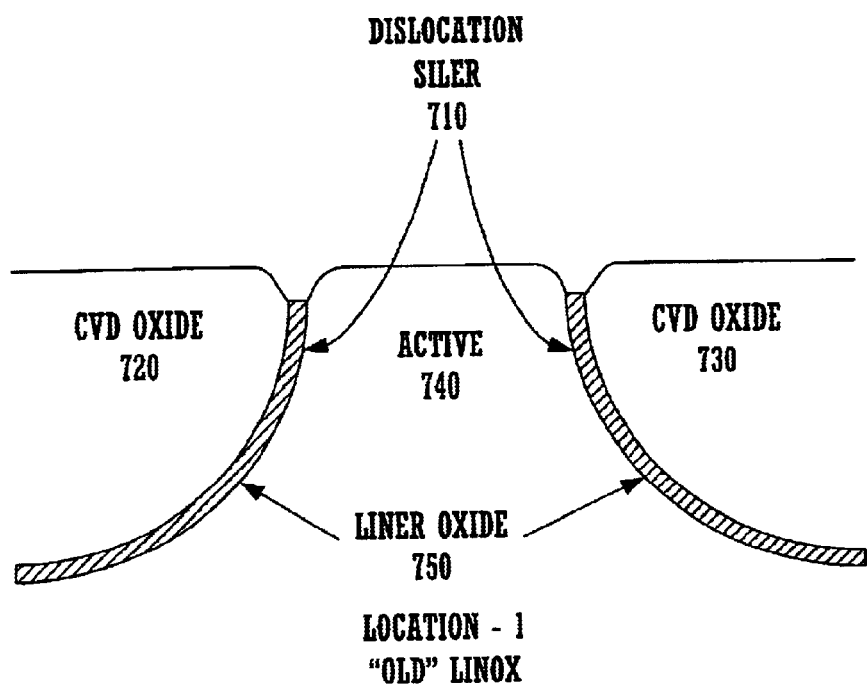
FIG. 7 illustrates a cross-sectional view showing possible damage after Poly/spacer etch in accordance with one embodiment of the present invention.

In the present invention, the density of the liner oxide is greatly increased by annealing which reduces or eliminates gouging. FIG. 7 is a cross-sectional view 700 illustrating regions where dislocations 710 may occur when the liner oxide 750 is not annealed. The combination of stress and gouging in the liner oxide 750 may cause dislocations 710 in the active regions 740 of the semiconductor substrate as illustrated in FIG. 7. Such dislocations may increase electrical current leakage around isolation regions 720 and 730, and may result in active device failures. Such gouging and dislocation formation are particularly troublesome when a poly/spacer edge overlaps an active area at a sharp corner.

Figure 8:
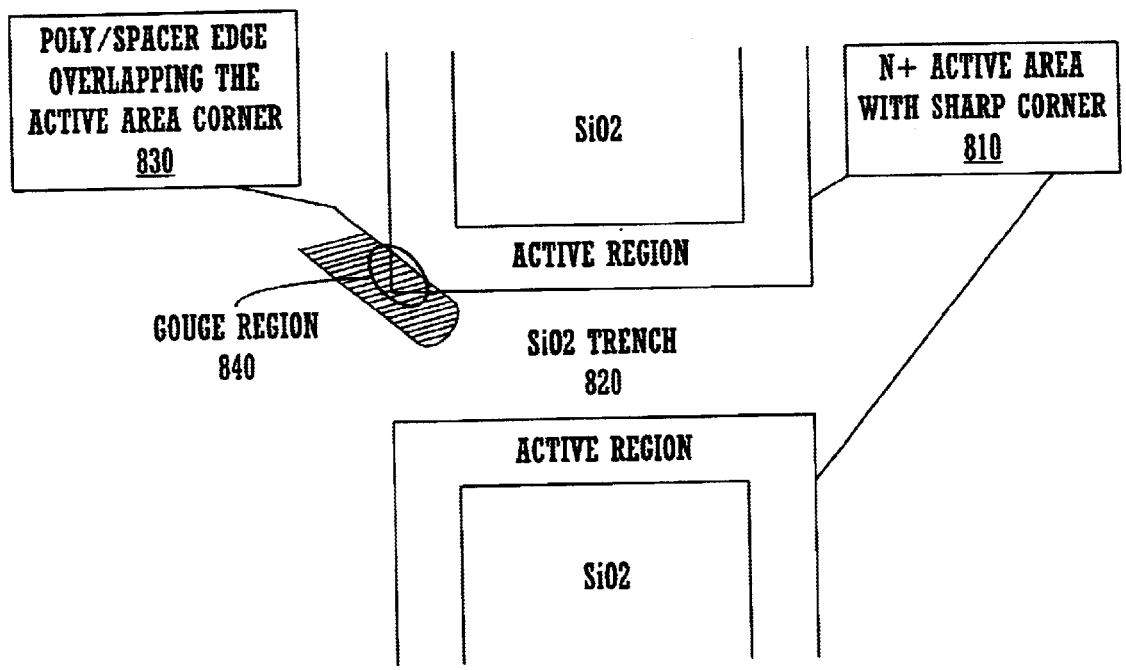
FIG. 8 illustrates a planar-view showing Poly/spacer edge overlapping an active area corner in accordance with one embodiment of the present invention.

FIG. 8 illustrates a planar-view 800 of a semiconductor wafer. Two active regions 810 are separated by a shallow trench isolation region 820. An etched poly line 830 overlaps a sharp corner of the upper active region 810. The gouge region 840 is an area where possible gouging and dislocations may occur as a result of the poly/spacer etch. In the present invention, annealing of the LINOX in the trench 820 reduces or eliminates gouging during poly/spacer etch. As a result, dislocations are eliminated which reduces electrical current leakage between active regions. Furthermore, limitations on the layout of poly lines are relaxed since annealing the LINOX has eliminated the gouging problem.

Figure 9:
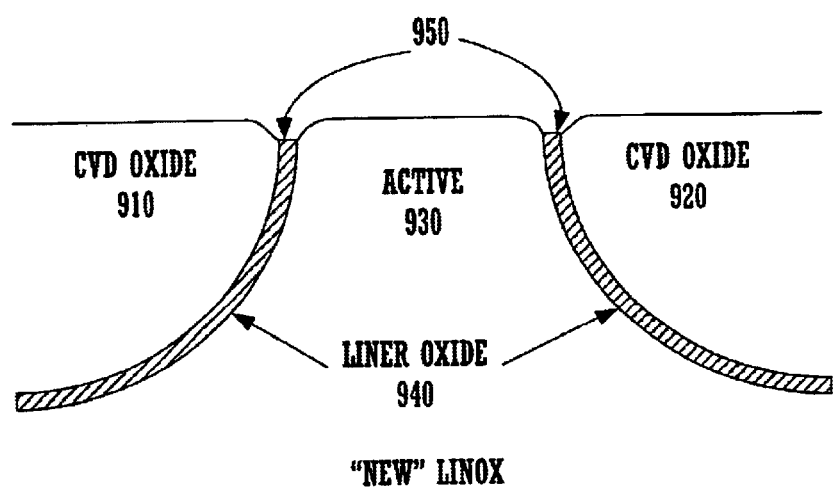
FIG. 9 illustrates a cross-sectional view showing the minimal Poly/spacer etch damage after annealing the LINOX in accordance with one embodiment of the present invention.

FIG. 9 is the cross-sectional view 900 of an active area 930 separated by two isolation regions 910 and 920 in which the LINOX 940 has been annealed in accordance with one embodiment of the present invention. Annealing of the LINOX has increased the density of the LINOX, reduced the stresses between the LINOX and the semiconductor active area. The gouging and resultant dislocations that may occur at points 950 during poly/spacer etch have been eliminated. As a result, the problems caused by poly/spacer etch over active areas with sharp corners no longer exist. Thus, prior limitations placed on the topology of poly lines have been eliminated.

The preferred embodiment of the present invention, a process for reducing leakage in a SRAM cell with shallow trench isolated active areas, is thus described. While the present invention has been described in particular embodiments, it should be appreciated that the present invention should not be construed as limited by such embodiments, but rather construed according to the below claims.

What is claimed is:

1. A process for providing shallow trench isolation on the surface of a silicon semiconductor substrate comprising:

forming a trench on the surface of the substrate;

heating said substrate to a first temperature in a first gaseous environment for a first period of time;

increasing the temperature of said substrate to a second temperature;

holding the temperature of said substrate at said second temperature for a second period of time in a second gaseous atmosphere;

holding the temperature of said substrate at said second temperature in a third gaseous environment for a third period of time to grow a liner oxide on a surface of said trench;

increasing the temperature of said substrate from said second temperature to a third temperature in a fourth gaseous environment for a fourth period of time in order to anneal the liner oxide.

2. The process of claim 1, wherein said first temperature is about 800 degrees centigrade.

3. The process of claim 1, wherein said first gaseous environment comprises argon and oxygen.

4. The process of claim 1, wherein said second temperature is equal to about 1000 degrees centigrade.

5. The process of claim 1, wherein said second gaseous environment comprises argon.

6. The process of claim 1, wherein said third gaseous environment comprises oxygen and chlorine.

7. The process of claim 1, wherein said third temperature is equal to about 1050 degrees centigrade.

8. The process of claim 1, wherein said fourth gaseous environment comprises nitrogen.

9. The process of claim 1, wherein said fourth period of time is equal to about three hours.

10. The process of claim 1, including the step of decreasing the temperature of said substrate from said third temperature to a fourth temperature, and filling said trench with a CVD oxide at said fourth temperature.

11. The process of claim 10, wherein said fourth temperature equals 800 degrees centigrade.

* * * * *